(12) United States Patent
Tamba

(10) Patent No.: US 7,327,301 B2
(45) Date of Patent: Feb. 5, 2008

(54) SINGLE END TO DIFFERENTIAL SIGNAL CONVERTER

(75) Inventor: Mamoru Tamba, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 853 days.

(21) Appl. No.: 10/809,299

(22) Filed: Mar. 25, 2004

(65) Prior Publication Data

US 2004/0201510 A1    Oct. 14, 2004

(30) Foreign Application Priority Data

Apr. 10, 2003   (JP) .............................. 2003-106135

(51) Int. Cl.
*H03M 1/12* (2006.01)
(52) U.S. Cl. ......................................... 341/155; 327/77
(58) Field of Classification Search ................ 341/155; 327/77, 131, 108; 330/69
See application file for complete search history.

(56) References Cited

U.S. PATENT DOCUMENTS 6,002,299 A * 12/1999 Thomsen ........................ 330/9
6,798,268 B2 * 9/2004 Kim et al. .................... 327/359
2002/0113626 A1   8/2002 Felder .......................... 327/77

FOREIGN PATENT DOCUMENTS

DE         690 12 468        5/1995
WO         WO 01/59928       8/2001

OTHER PUBLICATIONS

Analog Devices AD6644, Data sheet, p. 12, Fig. 10 A, 2004.
Analog Devices AD9432, Data sheet, p. 11, Fig. 10, 2002.
Analog Devices AD8351, Data sheet, p. 12, Fig. 8, 2004.
Dec. 11, 2006 Search Report for German Patent Application No. 10 2004 016 842.3.

* cited by examiner

Primary Examiner—Peguy JeanPierre

(57) ABSTRACT

A single end to differential signal converter comprising a low-frequency transmission step, which mixes the direct current and low-frequency components of single-ended signals with in-phase voltage signals to generate low-frequency signals, and a high-frequency transmission step, which mixes the high-frequency component of these single-ended signals and these low-frequency transmission signals to generate differential signals.

5 Claims, 6 Drawing Sheets

SINGLE END TO DIFFERENTIAL SIGNAL CONVERTER

FIELD OF THE INVENTION

The present invention pertains to a converter and a method with which single-ended signals are converted to differential signals, and in particular, pertains to a converter and a method with which single-ended signals are converted to differential signals before they reach a high-speed, broadband, low-noise, low-distortion analog-digital converter (ADC hereafter) having differential input that is generally used in fields such as instrumentation or communications.

DISCUSSION OF THE BACKGROUND ART

Many of the ADCs that have been used in instrumentation or communications systems, including artificial satellites and wireless base stations, in recent years have been differential input ADCs. This is because the signal amplitude of each line of differential input is half that of single-ended input and therefore, distortion is rare and the even-order distortion and the in-phase component noise that are generated by circuits in front of the ADC are canceled by the differential input of the ADC, making it possible to realize the properties of broad band, low noise, and low distortion. However, when the input signals are single-ended signals, it is necessary to set up in front of the ADC a signal converter that converts single-ended signals to differential signals.

A single end to differential signal converter having a broad-band pulse transformer 10 with a midpoint input terminal on the secondary side such as that shown in FIG. 1 is generally used for this type of converter. ADC 11 has a single power source 102 and therefore, gives in-phase voltage signals 101 that are half the power source voltage to the midpoint on the secondary side of broad-band pulse transformer 10. Broad-band pulse transformer 10 is generally a passive component capable of transmitting high frequencies of 500 MHz or higher and theoretically, it has the excellent advantages of not generating noise, as well as not generating distortion as long as the core remains unsaturated. Thus, the high-frequency properties of ADC 11 with low-noise and low-distortion performance can be realized indefinitely. However, because the transformer does not allow low-frequency signals to pass, it cannot be used for, for instance, the front end circuit of measuring apparatuses that measure direct current and low frequency signals, such as noise analysis that includes low frequency (FFT).

A circuit that makes inverting and non-inverting differential signals while providing the in-phase voltage signals 101 necessary for ADC 11 input using ordinary operational amplifiers 12 through 14 as shown in FIG. 2(a), or a circuit that uses an ordinary power source having in-phase voltage signal input and ordinary differential amplifier 15 as shown in FIG. 2(b), is generally used when processing signals that include direct current signals and low-frequency signals. However, these converters use dynamic components and therefore, noise is generated in an amount that cannot be disregarded. In addition, it is necessary to make the entire circuit small enough that it can process signals at a concentrated constant for high-speed processing, but the circuit scale increases and there is deterioration of high-frequency properties when the number of components is increased. In this regard, the circuit structure in FIG. 2(b) is simple, but ordinary dual-power sources and differential amplifier 15 generally have a low gain band width and therefore, distortion at high frequency increases. That is, the circuit in front that uses an ordinary operational amplifier as shown in FIG. 2 has a disadvantage in that although low-frequency properties, including direct current, are good, high-frequency properties and the properties of noise and distortion are poor.

Moreover, when single-power source-type differential amplifier 16 shown in FIG. 3 is used, broad-band, low-noise, low-distortion signals can be processed with an amplifier only, but because it is a single-power source-type amplifier, in-phase voltage signals 101 are necessary. When the dual-power source-type differential amplifier 17 shown in FIG. 3(a) with a low gain band width is added in front of single-power source-type differential amplifier 16 in order to process these in-phase voltage signals 101 by addition, the high-frequency properties of the converter as a whole deteriorate. Moreover, when the single-power source-type differential amplifier 16 shown in FIG. 3(b) is used with AC coupling, the in-phase signals 101 can be processed by addition using a bias circuit housed inside amplifier 16 and the properties of broad band, low noise and low distortion can be realized. However, the low frequency component is cut out by capacitor 18 before signal input and therefore, direct current signals and low-frequency signals cannot be processed. In particular, a single power source-type differential amplifier cannot be used for the circuit in front of signal input to an ADC of measurement apparatuses and the like.

Thus, mechanical parts such as ADCs are intended to realize broad band, low noise and low distortion, but there is no circuit in front of the ADC for processing signals that range from low-frequency signals including direct current signals to high-frequency signals and realizing low noise and low distortion and therefore, there is a technical problem in that the performance of the entire system deteriorates.

The present invention solves the problems by providing a broad-band, low-noise, low-distortion single end to differential signal converter, i.e., a low-noise, low-distortion single end to differential signal converter that processes signals ranging from low-frequency signals that include direct current signals to high-frequency signals.

SUMMARY OF THE INVENTION

A single end to differential signal converter comprising a low-frequency transmitter, which mixes the direct current and low-frequency component of the single-ended signals with the in-phase voltage signals to generate low-frequency transmission signals, and a high-frequency transmitter, which mixes the high-frequency component of the singled-end signals and the low-frequency transmission signals to generate the differential signals.

By means of this device, input signals are input to both a low-frequency transmission part that is also capable of transmitting direct current signals and a high-frequency transmission part that has low noise and low distortion properties and as a result, a broad band can be realized. Moreover, the in-phase voltage signals are mixed at the low-frequency transmission part and these mixed low-frequency transmission signals are mixed at the high-frequency transmission part. Therefore, single-ended signals can be converted to differential signals without compromising high-frequency properties.

A single end to differential signal converter comprising an input terminal for single-ended signals; an input terminal for in-phase voltage signals; an output terminal for differential signals; a low-frequency transmission step that mixes the direct current and low-frequency components of the single-ended signals and the in-phase voltage signals to produce low-frequency transmission signals; and a high-frequency transmission step that mixes the high-frequency component of the single-ended signals and the low-frequency transmission signals to generate the differential signals.

The single end to differential signal converter according to mode 1, wherein the high-frequency transmitter has multiple transformers; the high-frequency component is input to the primary side of these multiple transformers; and the low-frequency transmission signals are input to the midpoint input terminal on the secondary side of said multiple transformers.

The single end to differential signal converter, wherein the high-frequency transmitter has multiple single-power source-type differential amplifiers with in-phase voltage terminals; and the low-frequency signals are input to these in-phase voltage input terminals.

An analog-digital conversion method, comprising the step whereby the direct current and low-frequency component of single-ended signals are mixed with in-phase voltage signals to generate low-frequency transmission signals; the step whereby the high-frequency component of these single-ended signals and these low-frequency transmission signals are mixed to generate differential signals; and the step whereby these differential signals are converted to digital signals.

A measuring apparatus, comprising a signal input means that inputs measurement signals; an in-phase voltage signal generator means; a low-frequency transmitter that mixes the direct current and low-frequency component of these measurement signals with these in-phase voltage signals to generate low-frequency transmission signals; a differential signal generation means that mixes the high-frequency component of these measurement signals and these low-frequency transmission signals to generate differential signals; an analog-digital conversion means that converts these differential signals to digital signals; and a signal processing means that processes these digital signals.

DETAILED DESCRIPTION OF THE PREFERRED EMBODIMENT

The single end to differential signal converter that is the preferred embodiment of the present invention and an analog-digital conversion method and measuring apparatus that use the same converter will now be described in detail while referring to the attached drawings.

Figure 4:
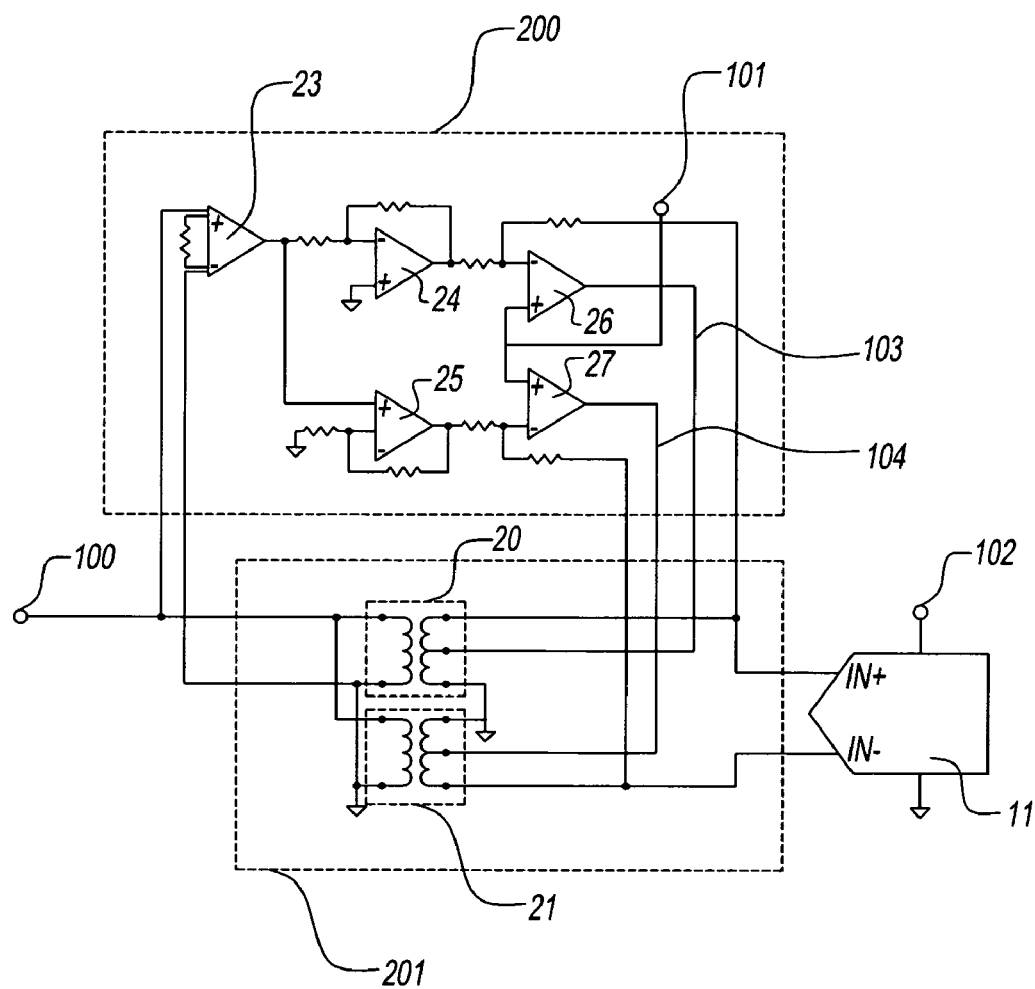
FIG. 4 is a circuit diagram of a preferred embodiment of the present invention.

FIG. 4 shows the structure of the entire single end to differential signal converter that is the preferred embodiment of the present invention.

Low-frequency transmission step 200 in FIG. 4 comprises a high-impedance input differential amplification component 23, differential signal generation components 24 and 25, and in-phase voltage signal addition processing components 26 and 27. Moreover, high-frequency transmission step 201 comprises a pair of pulse transformers 20 and 21 with conforming properties and having a midpoint input terminal on the secondary side.

Input signal 100 is supplied to high-impedance input differential amplification component 23 and the starting point of the primary side of pulse transformers 20 and 21. High-impedance input differential amplification component 23 is a buffer such that differential signal generation components 24 and 25 do not have an effect in the impedance of input signal 100, and comprises a differential amplifier. The output signals of high-impedance input differential amplifier 23 are supplied to differential signal generation components 24 and 25, which are comprised of a pair of dual-power source-type operational amplifiers having conforming properties. The output signals of differential signal generation components 24 and 25 are supplied to the minus terminal of in-phase voltage signal addition processing components 26 and 27, which are comprised of a pair of dual-power source-type operational amplifiers having conforming properties. On the other hand, in-phase voltage signals 101 are input to the plus terminal of in-phase voltage signal addition processing components 26 and 27. Low-frequency transmission signals 103 and 104, which are the output of in-phase voltage signal addition processing components 26 and 27, are connected to the midpoint input terminals on the secondary side of pulse transformers 20 and 21, respectively. The end point on the secondary side of pulse transformer 20 and the starting point on the secondary side of pulse transformer 21 are grounded. The starting point on the secondary side of pulse transformer 20 and the end point on the secondary side of pulse transformer 21 are connected to differential input-type ADC 11.

The operation of the circuit in FIG. 4 will now be described. Input signal 100 of the single-ended signals is input to low-frequency amplification step 200 and high-frequency amplification step 201. The signals that have been input to low-frequency amplification step 200 are input through high-impedance input differential amplification component 23 to differential signal generation components 24 and 25. Differential signal generation components 24 and 25 support positive-phase signals and reverse-phase signals, respectively. The output of differential signal generation components 24 and 25 is input to in-phase voltage signal addition processing components 26 and 27 and the low-frequency component of input signal 100 is amplified. Moreover, in-phase voltage signal 101 necessary for ADC 11 input is applied to produce low-frequency transmission signals 103 and 104. Thus, each part of low-frequency amplification step 200 uses ordinary dual-power source-type operational amplifiers under restricted bands in order to guarantee certain distortion and noise properties and therefore, virtually no part of the high-frequency component of input signal 100 passes through, while mainly low-frequency signals that include direct current are transmitted.

On the other hand, by means of high-frequency amplification step 201, the pair of pulse transformers 20 and 21 transmit positive-phase signals and reverse-phase signals, respectively. Pulse transformers 20 and 21 cannot transmit the low-frequency component from the primary side to the secondary side and therefore, mainly the high-frequency component of input signal 100 is transmitted. Differential signals are generated by mixing the high-frequency component of input signal 100 with low-frequency transmission signals 103 and 104 to which in-phase voltage signal 101 has been applied. The differential signals are converted from analog to digital form by ADC11.

Thus, broad band is realized by inputting input signal 100 into both the low-frequency transmission part that is also capable of transmitting direct current signals and the high-frequency transmission part having low noise and low distortion properties and performing single end to differential signal conversion. Low-frequency transmission step 200 comprises five operational amplifiers and therefore, the circuit scale is increased. However, the frequency that is processed is low frequency including direct current with an extremely highly concentrated constant and therefore, there is no degradation of properties as a result of the enlargement of the circuit scale. Moreover, high-frequency transmission step 201 comprises pulse transformers 20 and 21, which are passive components, and therefore, it has the same low noise and low distortion properties as the circuit in FIG. 1.

Figure 1:
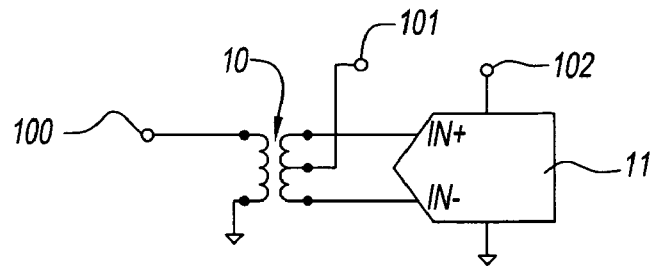
FIG. 1 is a drawing showing a typical conventional single end to differential signal converter.
Figure 5A:
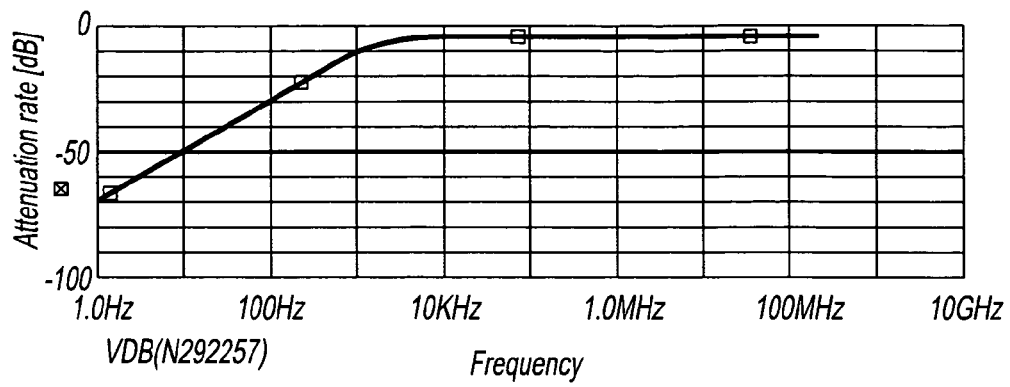
FIG. 5a is a chart depicting the transmission frequency properties according to the prior art converter of FIG. 1.
Figure 5B:
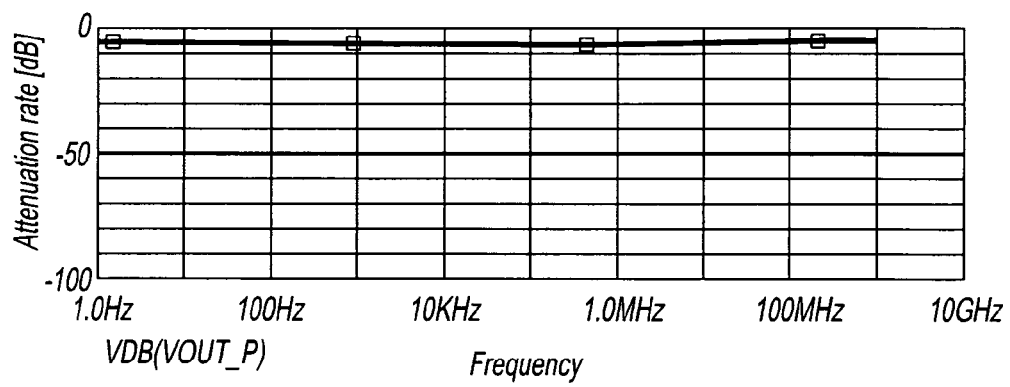
FIG. 5b is a chart depicting the transmission frequency property according the converter of the present invention.
Figure 5C:
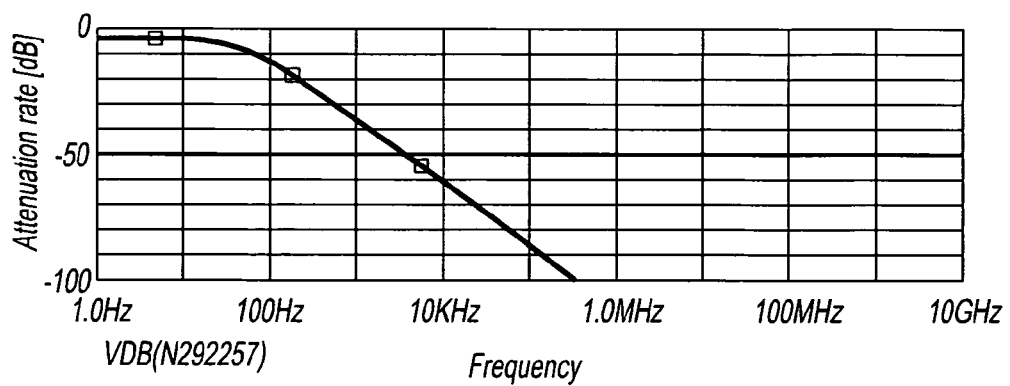
FIG. 5c is a chart depicting the low-frequency transmission properties according to the converter of the present invention.

FIG. 5 is a drawing showing a comparison of the transmission frequency properties with those of the prior art shown in FIG. 1. The x-axis in the graph shows the frequency of input signal 100 and the y-axis shows the signal attenuation factor between input and output signals of the single end to differential signal converter. FIG. 5(a) represents the transmission properties of the prior art in FIG. 1. The transmission properties suddenly deteriorate at a frequency of 10 kHz or less. On the other hand, the properties of the embodiment of the invention shown in FIG. 5(b) show that the frequency properties are very flat, from low frequencies to high frequencies, because a low-frequency transmission part having the frequency properties shown in FIG. 5(c) is set up using the LT1007 operational amplifiers of Linear Technology Corporation. Therefore, it is clear that by means of the converter of the present embodiment, low-frequency transmission step 200 and high-frequency transmission step 201 complement one another and a converter with a very broad band can thereby be realized.

Figure 3A:
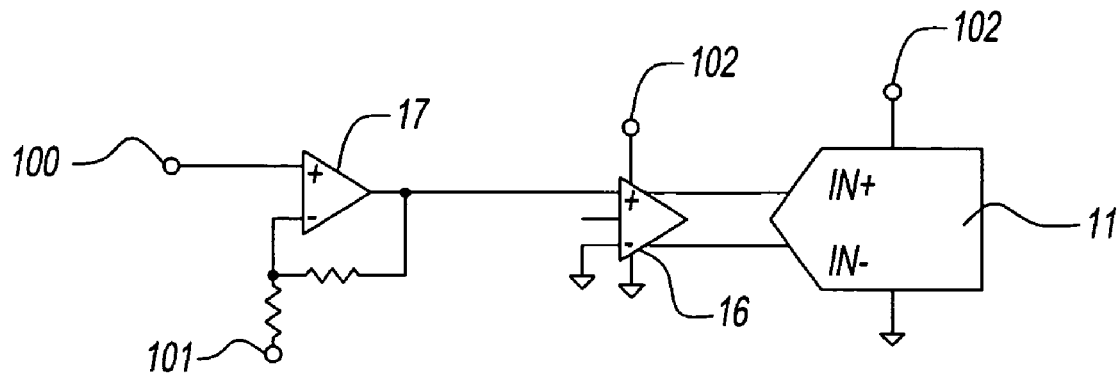
FIGS. 3a and b is a drawing showing a typical conventional single end to differential signal converter.
Figure 3B:
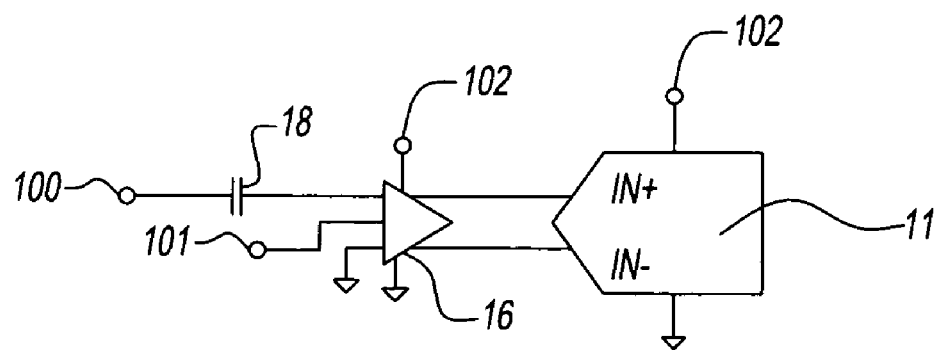
Figure 6:
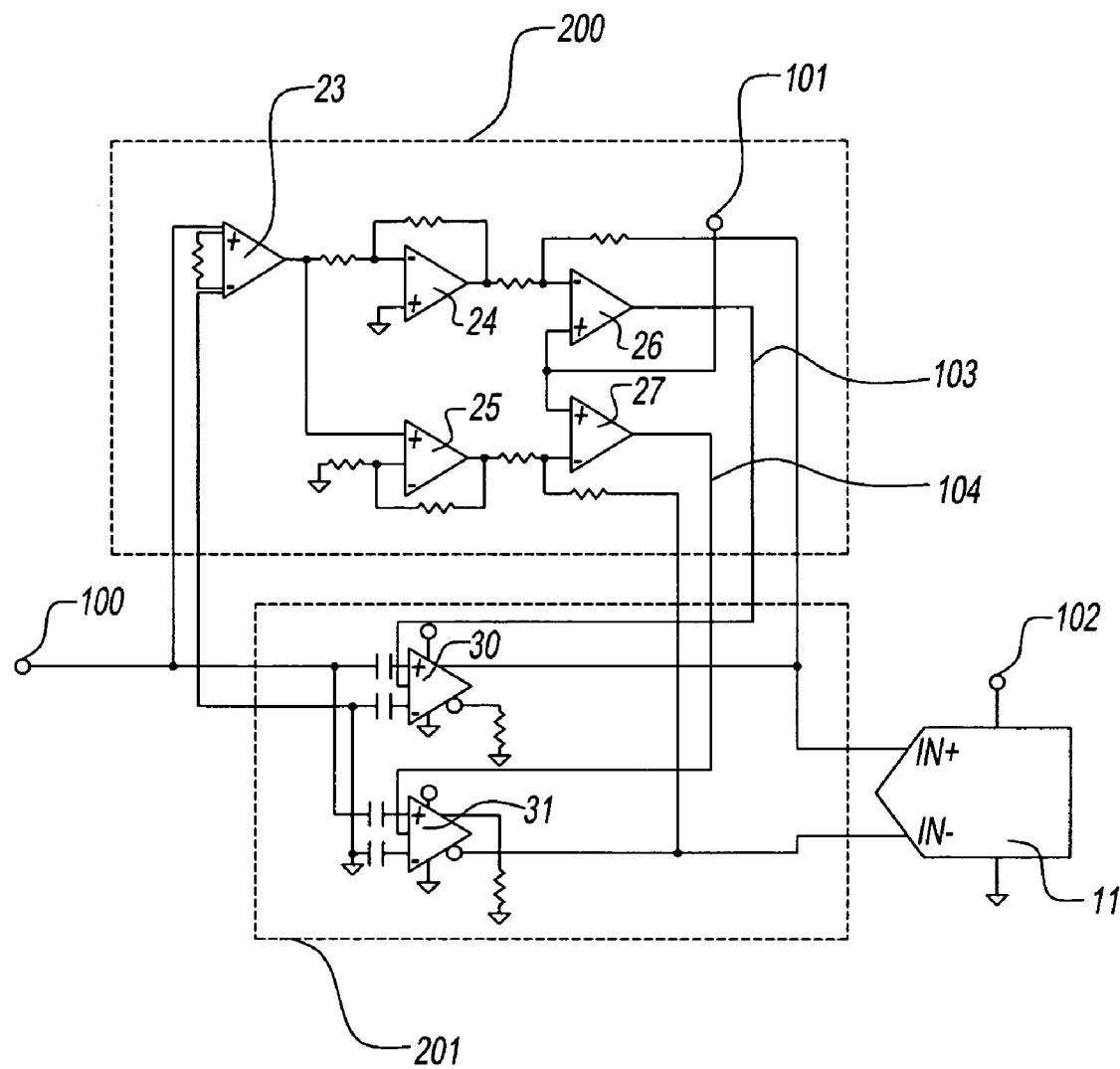
FIG. 6 is a circuit diagram showing a modified version of a preferred embodiment of the present invention.

Next, modified examples of the embodiment of the present invention are shown in FIG. 6. As with the converter in FIG. 4, the converter in FIG. 6 comprises low-frequency transmission step 200 and high-frequency transmission step 201. Moreover, the structure and operation of low-frequency transmission part 200 is the same as in the embodiment. The present embodiment differs from the embodiment in that high-frequency transmission step 201 comprises a pair of single-power source-type differential amplifiers 30 and 31 with corresponding properties. Single-power source-type differential amplifiers 30 and 31 support positive-phase signal transmission and reverse-phase signal transmission, respectively. As in FIG. 3(b), the single-power source-type differential amplifier requires that signal input 100 be performed by AC coupling and therefore, input signal 100 is input through a capacitor to amplifiers 30 and 31. Moreover, low-frequency transmission signals 103 and 104 are input from an in-phase voltage input terminal and are mixed with the high-frequency component by a bias circuit inside the amplifiers to obtain differential signals. The differential signals are converted from analog to digital form by differential input-type ADC11.

Thus, part 200 for transmitting low frequency that includes direct current and high-frequency transmission part 201 are separated, with the high-frequency transmission part comprising single-power source-type differential amplifiers 30 and 31 having good high-frequency properties. As a result, single end to differential signal conversion, from direct current signals to high-frequency signals, can be performed while realizing the low-noise and low-distortion properties inherent to amplifiers 30 and 31.

Figure 2A:
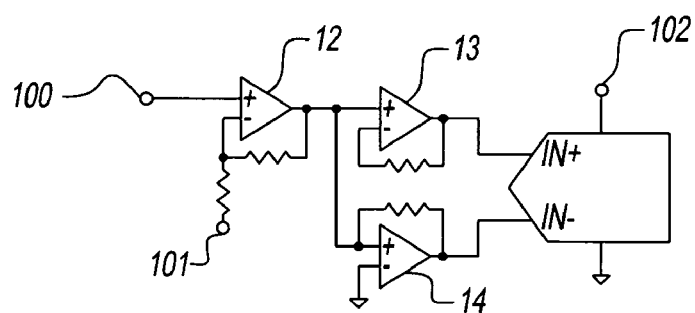
FIGS. 2a and b are drawings showing a typical conventional single end to differential signal converter.
Figure 2B:
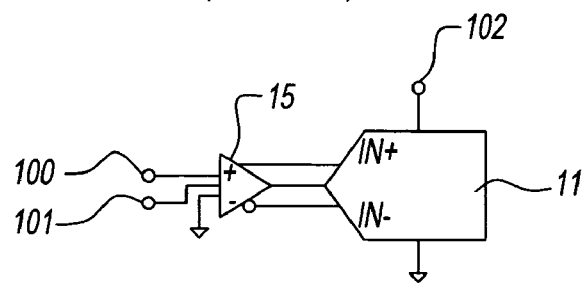

Table 1 is a figure showing a comparison of the high-frequency distortion factor of the prior art in FIG. 2(b) and that of the present embodiment. It is clear from the table that the high-frequency distortion factor of the present embodiment is smaller within all frequency regions when compared to the prior art.

TABLE 1

| Frequency | Prior art | Present embodiment |
|---|---|---|
| 10 MHz | −84 dB | −88 dB |
| 20 MHz | −71 dB | −86 dB |
| 50 MHz | −50 dB | −74 dB |
| 100 MHz | −42 dB | −58 dB |

Figure 7:
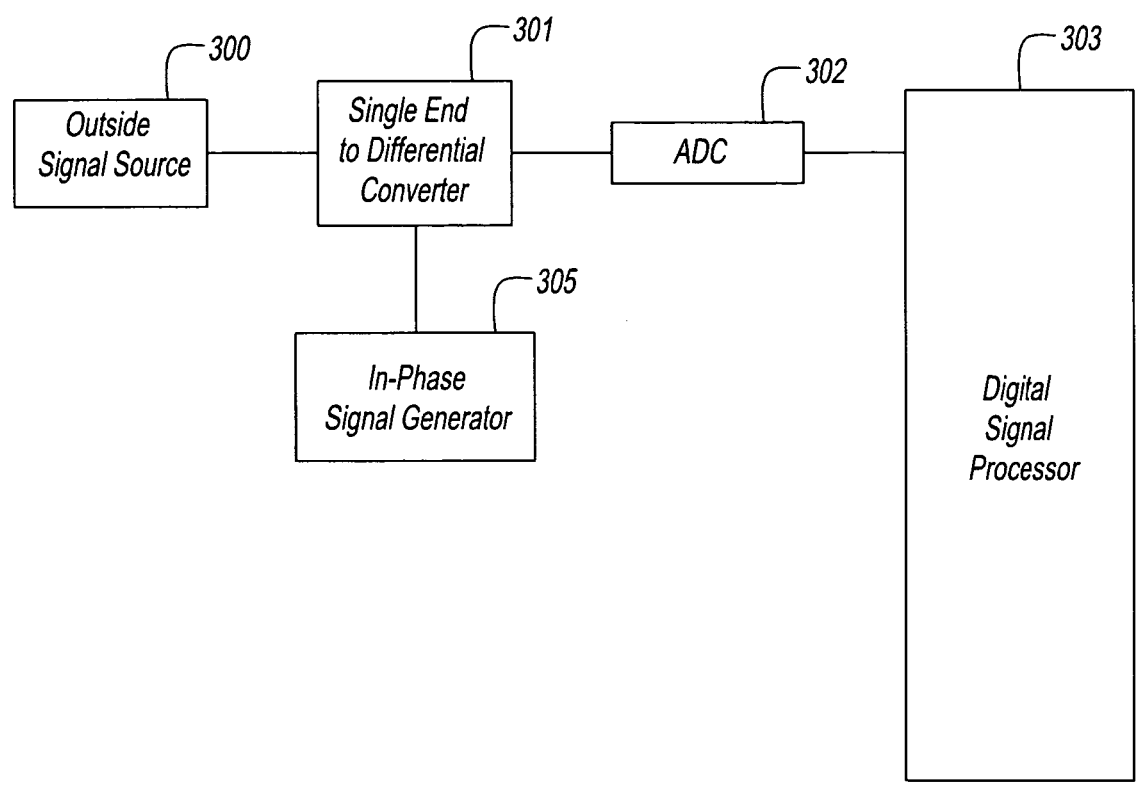
FIG. 7 is a block diagram showing a preferred embodiment of the present invention as it relates to a measuring apparatus.

FIG. 7 is a block diagram of a measuring apparatus that uses a single end to differential signal converter shown by the embodiment. The signal input from outside signal source 300 is processed by ADC 302 via the respective single end to differential signal converter 301 that is connected and is data-processed by digital signal processor 303. Moreover, in-phase signal generator 305 generates in-phase voltage signals for single end to differential signal converter 301 and supplies these signals to converter 301. The single end to differential signal converter 301 that is used is the embodiment. Therefore, measurement over a broad region, from direct current to high frequency, is possible. Moreover, because the single end to differential signal converter 301 is a low-noise converter, small input signals can also be measured.

It should be noted that although only outside signal source 300 is shown as the signal input source, another source can be used, as long as it is a signal source or input device that supplies single-ended signals.

It will be clear to persons skilled in the art that the embodiment and modified examples thereof are only one embodiment for describing the present invention cited in the claims and various modifications can be made within the rightful scope shown in the claims. Moreover, an example that uses a single end to differential signal converter as the circuit in front of the ADC is shown in the embodiment, but the present invention is not limited to being used in front of an ADC and can be widely used in fields in which a single end to differential signal converter requiring a broad band is necessary.

A result of the present invention is that single end to differential signal conversion is possible such that signals ranging from low-frequency signals including direct current signals and high-frequency signals are processed and noise and distortion are low. Another result of the present invention is that by using the converter of the present invention as the circuit in front of a broad-band ADC, analog-digital conversion that realizes the properties of broad-band ADC can be performed and in particular, measurement over a broad range and of small signals is possible in the field of measurement.

What is claimed is:

1. A single end to differential signal converter, comprising
an input for receiving at least one single-ended signal;
an input for receiving at least one in-phase voltage signal;
an output for emitting at least one differential signal;
a low-frequency transmitter that mixes a direct current and low-frequency component of said single-ended signal with said in-phase voltage signal, thereby generating a low-frequency transmission signal; and
a high-frequency transmitter that mixes a high-frequency component of said single-end signal with said low-frequency transmission signal, thereby generating a differential signal.

2. The single end to differential signal converter according to claim 1, wherein said high-frequency transmitter comprises at least one transformer; said high-frequency signal is input to a primary side of said transformer; and said low-frequency transmission signal is input to a midpoint input terminal on a secondary side of said transformer.

3. The single end to differential signal converter according to claim 1, wherein said high-frequency transmitter comprises at least one single-power source-type differential amplifier with an in-phase voltage terminal; and said low-frequency signal is input to said in-phase voltage input terminal.

4. An analog-digital conversion method, comprising
mixing a direct current and a low-frequency component of at least one single-ended signal with at least one in-phase voltage signal to produce a low-frequency transmission signal;
mixing a high-frequency component of said single-ended signal and said low-frequency transmission signal, thereby generating a differential signal; and
converting said differential signal to a digital signal.

5. A measuring apparatus, comprising
a signal input that inputs at least one measurement signal;
an in-phase voltage signal generator that generates at least one in-phase voltage signal;
a low-frequency transmitter that mixes a direct current and low-frequency component of said measurement signal with said in-phase voltage signal, thereby generating a low-frequency transmission signal;
a differential signal generator that mixes a high-frequency component of said measurement signal and said low-frequency transmission signal, thereby generating a differential signal;
an analog to digital converter that converts said differential signal to a digital signal; and
a signal processor that processes said digital signal.

* * * * *